United States Patent [19]

Burreson

[11] Patent Number: 4,845,429

[45] Date of Patent: Jul. 4, 1989

[54] INDUCTANCE DIVIDER SENSOR

[75] Inventor: Bernard J. Burreson, Seattle, Wash.

[73] Assignee: Eldec Corporation, Lynnwood, Wash.

[21] Appl. No.: 839,039

[22] Filed: Mar. 12, 1986

[51] Int. Cl.[4] .................. H01H 47/12; G01B 7/14; G01N 27/72

[52] U.S. Cl. .................. 324/234; 324/207; 361/179

[58] Field of Search .......... 324/234, 207; 340/547, 340/550, 551, 567, 661; 307/363, 116, 118; 361/179, 180

[56] References Cited

U.S. PATENT DOCUMENTS

| | | | |
|---|---|---|---|
| 2,200,863 | 5/1940 | Schuck | 340/87 O |
| 2,222,221 | 11/1940 | Burford | 324/61 P |
| 3,201,774 | 8/1965 | Uemura | 340/61 |
| 3,454,869 | 7/1969 | Strauss et al. | 324/234 X |
| 3,504,236 | 3/1970 | Miyagawa et al. | 361/179 |
| 3,867,689 | 2/1975 | Mori et al. | 324/234 |
| 4,045,728 | 8/1977 | Fletcher et al. | 324/59 |
| 4,131,848 | 12/1978 | Battle | 340/551 X |
| 4,219,740 | 8/1980 | Little | 307/116 X |
| 4,334,204 | 6/1982 | Buchanan | 335/205 |
| 4,416,289 | 11/1983 | Bresler | 340/551 |
| 4,519,256 | 5/1985 | Daniels | 307/118 X |

Primary Examiner—Michael L. Gellner
Assistant Examiner—David Porterfield
Attorney, Agent, or Firm—Christensen, O'Connor, Johnson & Kindness

[57] ABSTRACT

A method and apparatus for sensing the proximity of a target object includes a sensor inductor ($L_S$, 38) connected in series with an identical reference inductor ($L_R$, 36) between an input and ground to form an inductive divider network. The sensor inductor is positioned so that its inductance can be varied in response to the proximity of a target object (14, 40) while the inductance of the reference inductor remains constant. Voltage pulses are periodically applied to the divider network from a source (32, 34) and divide across the reference and sensor in accordance with the ratio of the inductances, as varied or not by the presence of the target object. A detector (30) monitors the output of the divider network and provides a target status signal indicative of the proximity of the target object. For low-power operation, the detector circuit and conductive divider network are periodically and momentarily energized in synchronism. This enables configuration of a self-contained, leadless proximity sensor having a battery power source and an optical output.

15 Claims, 4 Drawing Sheets

INDUCTANCE DIVIDER SENSOR

BACKGROUND OF THE INVENTION

The present invention relates generally to the measurement of inductance and eddy current losses. More particularly, the invention concerns a sensor that utilizes an inductive divider circuit to monitor the proximity of a target object.

Proximity sensors and switches incorporating the same are well known in the art. Such switches have proven to be particularly useful and reliable under the extreme environmental conditions encountered in aerospace applications. Exemplary applications including monitoring the positions of such items as landing gears, doors, slats, and thrust reversers. For such applications, the proximity switches have taken one of several forms. In the so-called two-piece proximity switch, the sensor unit includes an inductive sensor unit that is located at a remote site and interconnected by a cable to its associated electronic circuitry. In the so-called one-piece proximity switch, the sensor unit and the electronic circuitry are both contained within a single case or container. In such switches, the sensor unit is typically configured by positioning a coil within one-half of a standard ferrite pot core. As is well known in the art, the inductance of the sensor indicator and/or the eddy current losses varies in accordance with variations of the target-to-sensor distance. By determining the inductance of the sensor, or the eddy current losses therein, the distance relationship between the target and the sensor can be ascertained.

Efforts have been made in the prior art to make the proximity switch and the sensor unit physically robust in order to be resistive to the extremes of temperature, vibration, and shock, as well as the chemicals, corrosive fluids, and adverse moisture conditions encountered in operation. Despite these efforts, physical enviromental conditions, as well as other conditions such as electrical transients and electromagnetic interference (EMI), and still affect the accuracy of the inductance or eddy current loss measurement, and, consequently, the reliability of the switching of the proximity-sensing unit. The physical environmental effects, generally temperature variations, cause the parameters of the sensing coil as well as temperature-affected voltages and currents in the sensitive electronics to adversely affect the accuracy. The majority of the variation in the sensor is a result of the temperature coefficient of the wire, which affects both the AC and the DC losses in the sensor assembly. Permeability changes in the core and target, along with loss changes in the core, case, and target from temperature, also cause inaccuracies. In the electronic circuitry that interfaces with the sensor, these variations typically cannot be discriminated against and, thus, appear as apparent target "losses" that result in actuation variations.

In order to reduce the temperature dependencies of inductor proximity-sensing systems, prior art devices have incorporated temperature-compensating measures. For example, U.S. Pat. No. 3,454,869 discloses a temperature-compensated sensor unit for a two-piece proximity switch. Yet another temperature compensation technique for a two-piece proximity-sensing switch is dislosed in U.S. Pat. No. 4,219,740. In the arrangement shown in this patent, a time-varying current is established through the sensor unit. When the voltage across the sensor unit reaches a predetermined reference level, a sensor control loop controls the current through the sensor unit so as to constrain the sensor voltage constants at the reference level. A retrieval stage then determines the rate of change of the sensor current when the sensor current goes to zero and provides a voltage representative of the inductance of the sensor inductor. The action of the sensor control loop cancels the effect of the equivalent shunt capacitance of the sensor unit while the action of the retrieval network cancels the effect of the equivalent series resistance of the sensor unit. Since each of these parameters is variable with changes in temperature, the overall effect is to provide a temperature-independent measure of the inductance of the sensor inductor. While such arrangements do provide some degree of temperature compensation, they do so at higher power levels and with less stability than is obtainable with this invention.

Aside from temperature and other physical environmental effects, electrical transients and EMI are the principal cause of inaccurate detection of proximity. Such electrical noise can enter the unit, either through the sensor unit or body or through the cable or wiring that connects the sensor unit to the electronic circuity or that interfaces the switch with other electronic circuitry.

SUMMARY OF THE INVENTION

The present invention provides a sensing technique and sensor that enable accurate, substantially temperature-independent measurement of inductance and eddy current losses and, thereby, enable monitoring of the proximity of a target object. In accordance with an important aspect of the invention, the sensor can be operated at greatly reduced current, typically two to three orders of magnitude less than known sensors. As a consequence of this inherently low-current operation, both the sensor and the electronic circuitry that monitor it can be powered from previously discounted and impractical source, such as batteries. A particularly important application of this battery power capability is in the configuration of a self-contained proximity sensor that requires no connections (e.g., wires or cables) with an external power source. By this eliminating the wires needed to bring power to the sensor and its associated sensing electronics, it becomes possible to utilize a fibroptic link to an associated receiver and, thereby, produce a "leadless" sensor unit that has no physical electrical connection to external devices. Advantageously, such a leadless device has high immunity to electrical transients and noise.

A preferred sensor in accordance with the invention comprises a sensor inductor and an identical reference inductor connected in series as an inductive divider between an input voltage source and ground. The sensor inductor and reference inductor are characterized by the same equivalent circuit, which includes inductance, equivalent series resistance, and equivalent shunt capacitance. The sensing indicator is situated so that its inductance can be varied in response to the proximity of a target object. The corresponding inductance of the reference inductor remains unaffected by the proximity of the target object. With this balanced structure, a measurement of inductance and eddy current losses in the sensor inductor is made by applying a pulse from the input voltage source and by measuring the resultant voltage output at the midpoint of the divider, i.e., at the junction between the sensor and reference inductors. In the balanced condition, when the sensor inductor is uninfluenced by the target object and both inductances are of equal value, the input pulse divides equally across the sensor inductor and reference inductor, producing a voltage output pulse having an amplitude that is one-half the amplitude of the input pulse. When the inductance and resistance of the sensor inductor change as the target object is brought near (increasing or decreasing depending upon the target material), the divider network becomes unbalanced. When a voltage pulse is applied to the input of this unbalanced network, it is divided unequally by the two inductances, producing an output voltage that is a pulse (ignoring small oscillations) having an amplitude that is related to the amplitude of the input pulse by the ratio of the inductances.

The balanced series arrangement of the two coils allows common changes within each coil assembly to cancel, thus making temperature stability inherent in the sensor design.

According to an additional aspect of the invention, a low-power proximity sensor unit includes a detector circuit that monitors the output of the inductive divider network and outputs a target-near indication when the target object is within a predetermined proximity to the sensor inductor. A pulse circuit periodically and simultaneously energies the detector circuit and the sensor and reference inductors. During this brief interval, the detector circuit makes its measurement of the inductance of the sensor indicator and, in accordance therewith, provides an output signal that is indicative of either a target-near or target-far condition. Both the sensor and the detector circuit are then deenergized and remain in that condition until again energized by the pulse circuit. In order to minimize power dissipation, the duration of the pulses, i.e., the sensor measurement interval, is short relative to the period between successive pulses during which the circuitry is deenergized. It is, of course, possible to use other arrangements of energization pulses to obtain additional advantages. For example, very high-speed measurements can be made in close succession since the detection time of the sensor has been minimized.

While the switching output of the detector may be used directly as a signal indicative of the target status, it is advantageous to add an additional output stage as, for example, a latch or memory circuit for storing the target status condition. A particularly advantageous output stage includes a light emitting diode (LED) that responds to the output of the detector circuit to produce a light pulse when there is a target-near condition. Using this arrangement together with a battery power source and an optical link to a receiver or other utilization device, enables elimination of all electrical wiring to the proximity sensor. By thus totally removing all wires as EMI input entry points, EMI immunity well beyond that achieved by known sensors is provided.

While the sensor assembly may take on several common forms such as so-called pot-cores, U-cores, E-cores, or discs, a configuration utilizing a common core material for both coils is the preferred arrangement.

BRIEF DESCRIPTION OF THE DRAWINGS

The invention can be understood by the following portion of the specification taken in conjunction with the accompanying drawings in which.

DETAILED DESCRIPTION OF THE PREFERRED EMBODIMENT

Figure 1A:
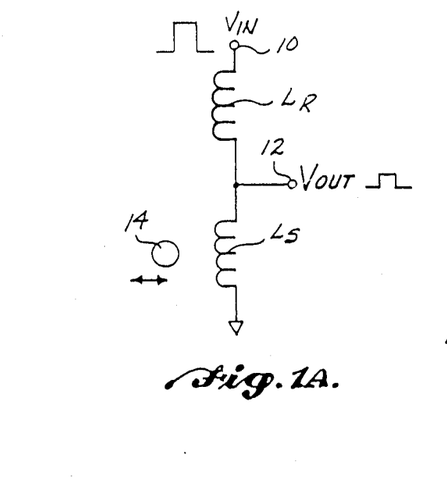
FIG. 1A is a schematic diagram of an inductive divider sensor according to the invention.

Referring to FIG. 1A, the sensor portion of the present invention includes a reference inductor $L_R$ connected in series with a sensor inductor $L_S$ between an input terminal 10 and ground (or other reference potential). The sensor inductor $L_S$ is situated so that its inductance varies in response to the proximity of a target object 14. In actual practice, either or both inductors may be utilized for sensing. As will be explained in greater detail below, this arrangement forms an inductive divider network such that the voltage $V_{OUT}$ appearing across the sensor inductor $L_S$ and at an output terminal 12 is related to the applied input voltage $V_{IN}$ and to the ratio of the inductances of the sensor inductor $L_S$ and the reference inductor $L_R$, i.e., $V_{OUT}$ equals $V_{IN}$ multiplied by the ratio of the inductances. The reference inductor and sensor inductors are preferably of equal inductance and arranged in a balanced manner so that they divide the input voltage equally when the target object 14 is beyond a threshold actuation range. When, however, the target object is within the actuation range, it varies the inductance of the sensor inductor and thereby produces an unequal, proportionate division of the input voltage across the two inductors. According to the inventive sensing technique, a very short-duration voltage pulse is applied to the divider network and the resultant voltage $V_{OUT}$ is quickly measured to provide an indication of the inductance of the sensor inductor $L_S$ and, thereby, the proximity of the target object.

Figure 1B:
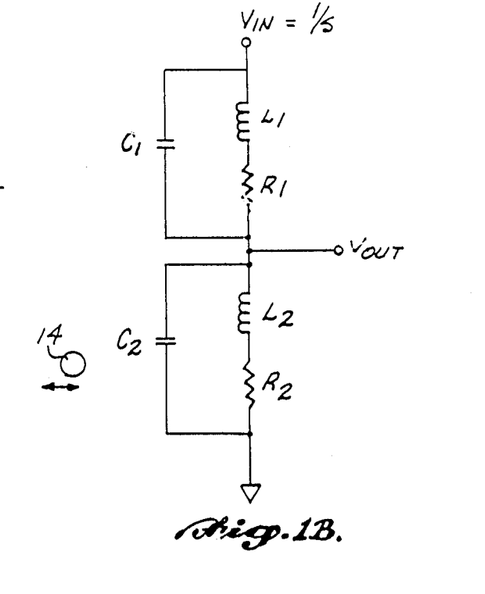
FIG. 1B is an analytic equivalent circuit for the sensor of FIG. 1A.

This can be better understood with reference to FIG. 1B, which shows the equivalent circuit for the arrangement of FIG. 1A. The reference inductor is characterized by its equivalent inductance $L_1$, its equivalent shunt capacitance $C_1$, and its equivalent series resistance $R_1$, while the sensor inductor $L_S$ is characterized by its equilavent inductance $L_2$, its equivalent shunt capacitance $C_2$, and its equivalent series resistance $R_2$. The Laplace transform of the output response of this circuit can be shown to be:

$$V_{OUT}(s) = \frac{V_{IN}(sL_2 + R_2)(s^2L_1C_1 + sC_1R_1 + 1)}{(sL_1 + R_1)(s^2L_2C_2 + sC_2R_2 + 1) + (sL_2 + R_2)(s^2L_1C_1 + sC_1R_1 + 1)} \quad (1)$$

If a step input ($V_{IN} = 1/s$) is applied, and if the two inductors are equal, so that $L_1 = L_2$, $C_1 = C_2$, and $R_1 = R_2$, then the inverse transform of $V_{OUT}(s)$ shows that:

$$V_{OUT}(t) = \frac{V_{IN}(t)}{2} \qquad (2)$$

Consequently, when the reference and sensor coils are identical and the target object is beyond the actuation range, an input pulse is evenly divided by the network, producing an output pulse having half the amplitude of the input pulse.

When the target object is brought near the sensor inductor, the balanced condition no longer exists. In actuality, this condition varies not only the inductance of the sensor inductor, but also the resistance (eddy current losses) thereof. Each of these parameters varies in a nonlinear manner, producing a complex waveform. It can be demonstrated by Fourier transform, however, that if a high-frequency voltage pulse is applied as the input, then the frequency components of this pulse will divide across the two inductors in accordance with the ratio of this inductances and resistances. The recombination of these frequency components in the time doman forms a pulse at the output, together with a small amount of damped oscillations. As will be shown below, compensation for these oscillations can be easily provided so that the sensor network can be made to operate as a simple voltage divider for a step input in both the balanced (target-far) and unbalanced (target-near) modes of operation.

As noted above, the sensing technique of the invention measures both inductance and eddy current losses in the sensor inductor. If the measurement of the output voltage is made very quickly, then the effects of the resistive term (i.e., the eddy current losses) can be minimized so that the measurement is made predominantly of the inductance. This is particularly advantageous, since the resistive term is temperature-dependent and, thus, capable of introducing inaccuracies into the measurements. Measuring quickly also provides the further advantage of minimizing the power dissipation.

Figure 2A:
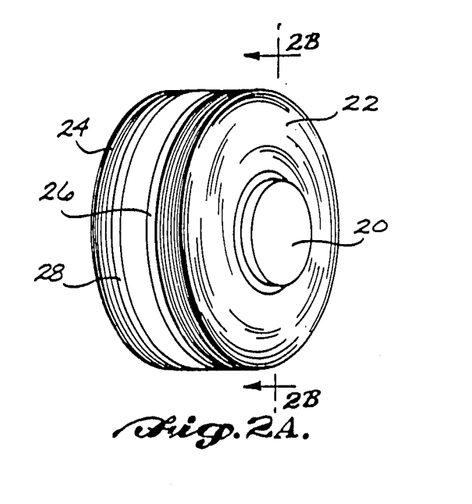
FIG. 2A is a pictorial view of one form of inductive divider sensor according to the invention.
Figure 2B:
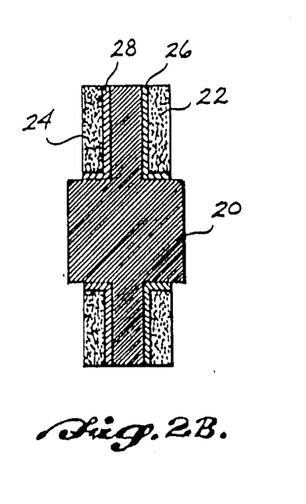
FIG. 2B is a cross-sectional view of the sensor of FIG. 2A.

Referring now to FIGS. 2A and 2B, a preferred implementation of the sensor has a reference coil 22 and a sensor coil 24 disposed on opposite sides of a ferrite core 20 and separated therefrom by insulative spacers 26 and 28, respectively. For illustrational purposes, the sensor has been simplified in these FIGURES with the electrical connections to, from, and between the coils being eliminated. To function as a divider network as described above, the reference coil 22 and sensor coil 24 are preferably identical in all respects with equal nominal values of inductance, and equivalent capacitance and resistance. Although the coils could be mounted remotely from one another and upon separate cores, the use of a single core has distinct advantages. First, it places the two coils in the same physical environments with the same temperature coefficients so that their temperature-dependent characteristics will track one another. Secondly, subsequently developing cracks or other physical variations in the core are likely to influence the coils in equal, offsetting manner. Thirdly, and importantly, the two coils can be connected together in such a manner that the currents induced therein by external fields oppose one another. As a result of this arrangement, and as a result of the coils being in close proximity to one another on the same core, the induced currents are of equal magnitude but opposite to one another so that the overall result is to cancel the effects of the external magnetic field. It will thus be seen that the preferred arrangement provides a sensor that is temperature stable, that operates on low power, and that cancels EMI from external sources.

Figure 3:
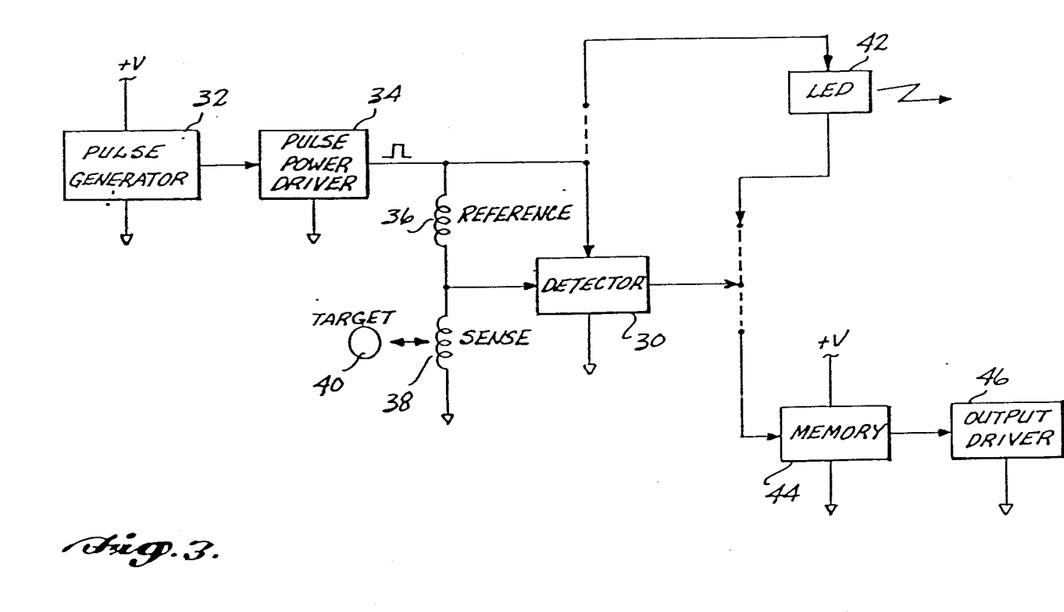
FIG. 3 is an electrical block diagram of a generalized version of a proximity sensor according to the invention, showing two alternative output stages.

With reference to FIG. 3, a low-power proximity sensor unit is configured by connecting the sensor described above with a detector circuit 30 and a pulse circuit consisting of a pulse generator 32 and a pulse power driver 34. The pulse generator 32 is connected to a power source and operates in a manner that will be readily understood to generate pulses of short duration (for example, 10 to 30 microseconds) that periodically occur at a relatively slow rate, for example, once every 100 milliseconds. These pulses are amplified by the pulse power driver 34 to produce drive pulses that periodically and simultaneously energize the detector 30 and the reference inductor 36 and sensor inductor 38. During each measurement interval defined by the duration of the drive pulse, the detector circuit measures the output of the sensor circuit appearing at the junction between the reference and sensor inductors. As discussed in detail above, in conjunction with FIGS. 1A and 1B, this output is a pulse whose amplitude corresponds to the proximity of the target 40 to the sense inductor 38. Means (not shown) are included to calibrate the detector circuit so as to produce an output signal that is indicative of a target-near condition when the target 40 is within a predetermined actuation range. At this present actuation range (which corresponds to a preset inductance value) the detector 30 provides a switching action at its output.

The elements of the FIG. 3 sensor described so far can be used independently in a known manner by connecting the output of the detector 30 with a utilization device or system. Since the sensor itself requires very little power it is advantageous to use low-power components in the detector. In addition, since the sensor itself is temperature stable, the detector circuit does not require temperature-compensating components and, thus, can be configured with relatively few components. Finally, since the pulse generator 32 and pulse power driver 34 are also configurable with the minimum number of components, the entire sensor can be housed within a small container. For such an implementation, it may be particularly desirable to increase the EMI rejection and transient immunity of the sensor by including a power source, such as a lithium battery, in the same container that houses the sensor and associated electronics.

Such a self-contained sensor has distinct advantages, especially when used in conjunction with an optical output stage. As shown in FIG. 3, such an output stage can be conveniently provided by connecting a light emitting diode between the output of the pulse power driver 34 and the output of the detector 30. By appropriately selecting the state of the switching action of the detector circuit 30 in relation to the state of the drive pulses, the LED will be strobed each time there is a target-near condition. On the other hand, when the target is beyond the actuation gap no output will be produced by the LED. The sensor thus configured is adapted to be used with a fiberoptic link to a receiver or other utilization system. Environmentally, this implementation is the soundest, since all necessary components of the sensor can be contained within the same rugged canister. Since the power source is self-contained, no wires exist as EMI entry points.

It is, of course, possible to utilize the sensor in a wire power configuration or in a battery-powered configuration with a different output stage. FIG. 3 illustrates an example of an alternative output stage in which the output of the detector circuit 30 is latched into a memory 44 and thereafter used to control an output driver 46. When a battery is used with an arrangement such as this, or one of the many possible variations thereon, a unique advantage follows. In particular, with the power source self-contained, the arrangement provides a switch that "floats," i.e., one which need not be referenced to the ground or supply potential of the system in which it is used. Consequently, such a proximity switch can be used in either an AC or DC system. In addition, any number of such switches can be connected in series, parallel, or in combination of the two to provide a logical switching configuration for a mechanical system. This is in marked contrast to the manner in which logical switching functions have been heretofore provided with known proximity switches by connecting the output of such switches with a separate logical control circuit.

Figure 4:
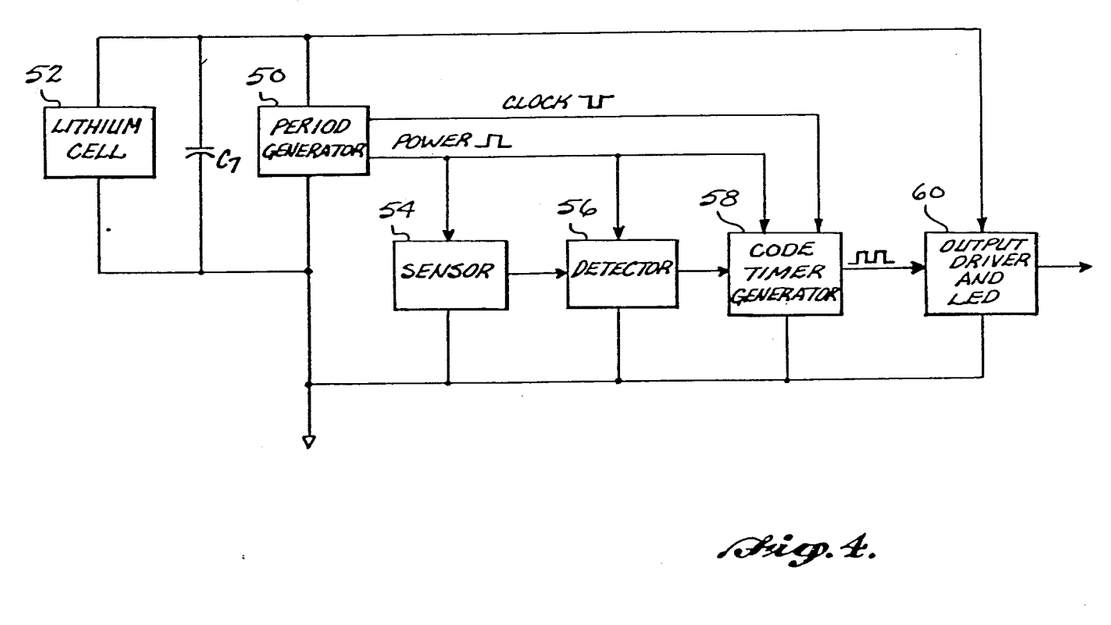
FIG. 4 is an electrical block diagram of a preferred embodiment of the proximity sensor.
Figure 5:
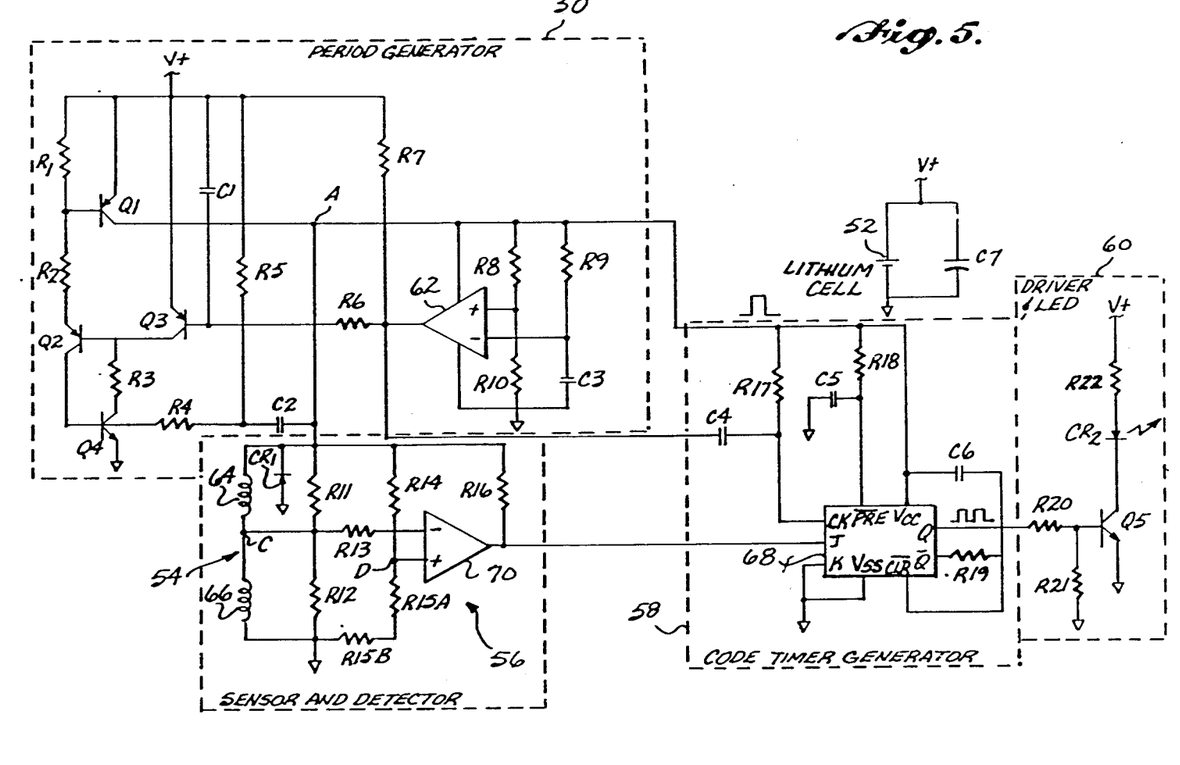
FIG. 5 is a detailed electrical schematic diagram of the proximity sensor of FIG. 4.

FIGS. 4 and 5 show a presently preferred implementation of the inventive proximity sensor, which has battery power and an optical output stage. Referring first to FIG. 4, this arrangement is functionally similar to the battery-powered LED output arrangement discussed in conjunction with FIG. 3. A period generator 50 is powered by a lithium cell 52 and functions in a manner similar to the pulse generator 32 and pulse power driver 34 (FIG. 3) to produce periodically occurring power pulses that briefly energize a proximity sensor 54 and a detector 56. These latter two components operate in a functionally equivalent manner to their counterparts in FIG. 3. The additional components of the FIG. 4 sensor arrangement include a capacitor C7 in parallel with the lithium cell and a code timer generator 58 and an output driver in LED stage 60. The capacitor C7 is included to avoid sending current pulses through the lithium cell during operation of the period generator. The code timer generator 58 is momentarily powered in synchronism with the energization of the detector 56 and sensor 54. During this active mode of operation, the code timer generator outputs pulses indicative of two distinct types of information. First, it provides an output pulse each time it is energized by the period generator. The output driver in LED stage 60 response to this pulse and produces a light pulse that can be used by an associated receiver as an indication of whether the sensor is still operable as an indication of the integrity of the optical link that connects the sensor with the receiver. In addition to this system status pulse, the code timer generator clocks through the output of the detector 56 to the output stage target position information, which is indicative of the position of the target. The clock pulse that controls this transfer of target position information is produced by the period generator 50 in a timed manner so that the target status information is output to the driver in LED stage 60 immediately following the system status pulse.

As discussed above, the period generator operates to output a narrow pulse of predetermined width at regularly occurring intervals. The manner in which these pulse width and timing functions are implemented can best be understood by assuming that the circuit shown in FIG. 5 is initially in an inactive state, and then suddenly connected to the power supply V+. The timing of the interval between pulses is controlled by the charging of capacitor C2. One side of this capacitor is connected to the supply through resistor R5, while the other side is normally tied to ground through resistors R11 and R12. In addition, the supply side of capacitor C2 is also connected through resistor R4 to the base of transistor Q4. As capacitor C2 charges toward the level of power supply V+, it reaches a voltage level that is sufficient to turn on transistor Q4. The collector of transistor Q4 is connected through resistor R3 to the collector of transistor Q3 and to the base of transistor Q2. It will be seen that transistors Q2 and Q4 are in a "hook connection" or form a "SCR" (silicon controlled rectifier) with base drive also supplied to transistor Q1 through transistor Q2. With transistor Q2 on, current flows from the supply V+ through resistors R1 and R2, producing a voltage drop that turns on transistor Q1. The collector output of transistor Q1 rises abruptly at point A. When this occurs, capacitor C2, which is normally connected to ground (via resistors R11 and R12), is pulled up abruptly to the potential at circuit point A. Resistor R4 and the base emitter junction of transistor Q4 provide a low impedance that allows capacitor C2 to discharge to ground, and, thus, stand prepared for recharging during the next cycle of operation.

The output of transistor Q1 is applied across a voltage divider network, consisting of resistors R8 and R10 so that a predetermined reference potential is applied to the positive input of a timing comparator 62. The output of Q1 is also impressed across an RC circuit consisting of resistor R9 and C3 so that a rising voltage ramp is applied to the negative input terminal of comparator 62. As soon as the ramp voltage applied to the negative input equals the divided voltage on the positive input, comparator 62 switches low. This, delayed by the RC circuit of R6 and C1, pulls the base of transistor Q3 low, turning on the same. When transistor Q3 turns on, its collector voltage rises, removing base drive from transistor Q2, thereby turning this transistor off. When this occurs, both transistors Q1 and Q4 also turn off. Thereafter, capacitor C2 begins charging again through resistor R5, thus initiating another cycle of operation of the period generator.

From the foregoing, it will be seen that the output of Q1 at circuit point A is a continuous sequence of equal-width pulses, which occur at equal, spaced-apart intervals. The timing of the leading edge of these pulses is controlled by the charging of capacitor C2 and the operation of the arrangement of bipolar transistors Q2, Q3, and Q4, while the timing of the trailing edge of the pulses (and hence the pulse width) is controlled by the charging of capacitor C3 through resistor R9, and R6 through C1.

The output of the period generator 58 (i.e., the pulsed output of transistor Q1) is fed to the sensor 54 and detector 56 where it is applied across the sense and reference coils, 64 and 66, respectively, and across a resistive divider consisting of resistors R14, R15A, and R15B. The output of the sensor, i.e., the voltage appearing at the connecting point C between the sense and reference coils is coupled through resistor R13 as the reference potential on the inverting input terminal of a detecting comparator 70. The voltage appearing at the junction point D between resistors R14 and R15A in the resistive divider network is connected to the noninverting input terminal of comparator 70. Using resistors R15A and R15B as calibrating resistors, the voltage level at circuit point D is set relative to the voltage level at the output C of the sensor so that the output of the comparator 70 switches high when the target object is brought into a predetermined actuation position relative to the sense coil 64. When the target object is beyond this actuation position, the ratio of the inductances of the sense and reference coils is such that balanced potentials appear on the inverting and noninverting input terminals of comparator 70. Consequently, during these target-far conditions, the output of comparator 70 is low. It will thus be seen that the state of the output of comparator 70 is a function of the proximity between the target object and the sense coil and, thus, is indicative of whether there exists a target-near or target-far condition. The state of this output is coupled to the J input of the JK flip-flop 68 in the code timer generator 58 and clocked through to the output driver and LED in timed synchronism with the timing cycle of the period generator 50.

In the discussion of FIGS. 1A and 1B it was noted that the inductive and resistive imbalances that exist in the target-near condition produce some relatively small oscillations that appear as a damped sine wave on top of the output pulse. To eliminate the effects of these oscillations, the detector includes a pair of damping resistors, R11 and R12, which are connected in parallel with the sense coil 64 and the reference coil 66, respectively. As an alternative to this forced damping of the oscillations, it is possible to omit the damping resistors and merely delay the measurement of output voltage long enough to allow the oscillations to dampen naturally. A third alternative is to arrange the sensor in a container so that the sense and reference coils must "look through" a lossy metal cap.

The code timer generator 58 has teo principal functions. First, it provides system status pulses that power up the LED CR2 in the output stage 60 and thereby provide information indicative of the operativeness (operating status or condition) of the system or an optical link that connects the system with an associated receiver. Secondly, the code timer generator clocks through the output of the sensor and detector circuitry to the LED to provide information indicative of the position of the target. The components of the code timer generator 58 function as follows to provide these functions.

As discussed above, during each active period of operation, transistor Q1 turns on and powers up the sensor coils and the detector. At the same time, the collector output of transistor Q1 is applied as an energizing potential to the supply terminal $V_{CC}$ of a JK flip-flop 68 included in the code timer generator 58. This potential is also impressed across an RC circuit (consisting of resistor R18 and C5) that is connected to an active low preset terminal $\overline{PRE}$ of the JK flip-flop 68. During the "long" inactive system periods, capacitor C5 settles to ground potential. As a consequence, when JK flip-flop 68 is powered up, there exists a low state on the $\overline{PRE}$ input that sets the Q output of the flip-flop to a high state. This transition is the beginning of the system status pluse that provides information concerning the operational status of the system. The width of this system status pulse, i.e., the trailing edge thereof, is controlled by an RC circuit (consisting of capacitor C6 and resistor R19) which is connected to the complementary output terminal $\overline{Q}$ and to the active low clear input terminal $\overline{CLR}$ of the flip-flop. Initially, $\overline{Q}$ is high so that a positive potential exists on capacitor C6. When, however, the $\overline{Q}$ output is set low (coincidentally with the presetting of the Q output high) a discharge path for capacitor C6 is established through resistor R19 into the $\overline{Q}$ terminal. In a predetermined time (determined by the time constant of capacitor C6 and resistor R19) capacitor C6 discharges to a low level that activates the $\overline{CLR}$ terminal. When this occurs, the Q output is cleared to a low state and the $\overline{Q}$ output is set high.

It will thus be seen that the system status pulse is produced by the timed activation of the preset and clear inputs of the JK flip-flop. This output pulse is produced at the beginning of each system period when the circuitry powers up and is produced regardless of the state of the sensor, i.e., regardless of the location of the target.

To provide an indication of the condition of the target, the output of the sensor and detector circuit is supplied to the J input of the JK flip-flop and clocked through to the output driver and LED stage 60 during and interval that occurs after the occurrence of the system status pulse but prior to the shutdown of the system. Referring again to the period generator circuitry, it will be recalled that the system shuts down when transistor Q3 turns on, producing a cascade effect through transistor Q2, which turns off the power drive transistor Q1. Although this shutdown operation is initiated when comparator 62 switches low, shutdown does not occur immediately because of the time required to draw sufficient charge from capacitor C1 through resistor R6 so as to pull the base on transistor Q3 low enough to forward bias the emitter junction. It is during this period of delay that the sensed condition of the target is coupled to the output driver through the JK flip-flop. If there is a target-near condition, there will be a high state on the J input that will result in the production of a second pulse on the Q output, i.e., a pulse following the initial power-up system status pulse. If, on the other hand, there is a target-far condition, there will be a low on the J input and, for that system period, only the single system status pulse will appear at the Q output.

The target status pulse is clocked in the following manner. First, it will be seen that the output of the timing comparator 62 is coupled by a capacitor C4 to the clock input CK of the JK flip-flop. The end of capacitor C4, which is connected to the clock input CK, is also tied through resistor R17 to the collector of transistor Q1. The other side of capacitor C4 is tied to the supply through resistor R7. During the active period of system operation, when transistor Q1 is turned on, these connections place substantially equal positive potential on each side of capacitor C4. When timing comparator 62 switches low at the end of its timing interval, this negative-going pulse is AC coupled through capacitor C4 to the clock input CK. Since this flip-flop is negative-edge triggered, and since the K input is permanently tied low, this clock pulse effectively clocks through the current state appearing on the J input. If the state is high, indicating a target-near condition, the circuit further operates to ensure that the duration of this pulse is identical to the duration of the system status pulse that immediately preceded it. This operation occurs in the following manner. It will be recalled that the duration of the system status pulse corresponds to the time required for capacitor C6 to discharge through resistor R19 to a level that clears the Q output to zero. When this occurs, $\overline{Q}$ is set high and, once again, there is equal positive potential on both sides of capacitor C6. When the high state attributable to the detected target status pulse appears at the Q output terminal, the $\overline{Q}$ terminal goes low again and C6 agan discharges through resistor R19. Since this discharge cycle is identical to the discharge of cycle for the system status pulse, the time required to place a low on the $\overline{CLR}$ input to terminate the system status pulse is identical to the time required to clear the Q output when terminating the system status pulse. Consequently, these pulses are of equal width.

The output of the code timer generator 58 (i.e., the Q output of the JK flip-flop) is fed through resistor R20 to a drive transistor Q5 in the output stage. A light emitting diode CR2 that produces the optical output of the sensor is connected to the collector of transistor Q5 and through a load resistor R22 to the lithium cell 52. It will be readily seen that the pulses and the target status pulses turn on transistor Q5 and energize the light emitting diode CR2. It will be recognized that many other forms of optical output can be provided.

From the forgeoing, it will be appreciated that the invention provides a means for sensing the proximity of a target object using a novel inductive division-measuring technique. Because of the inherent low-power operation of this technique, a sensor incorporating the same is easily configurable as a self-contained unit having its own source of power and operating on a cyclical basis, turing on briefly for proximity measurement purposes and then turning off and remaining off for a relatively long period of inactivity. The sensor element itself employs a reference coil and a sensor coil that can be arranged relative to one another so that the measurement of proximity is unaffected by changes in the temperature of the environment in which the element is located and uninfluenced by external magnetic fields to which the sensor is exposed.

The invention may also be used with an external power source in a more conventional wire configuration. Since the sensor requires only small amounts of current for operation, it is possible to significantly increase the input impedance (relative to the typical input impedance of conventional sensors) and thereby greatly increase the rejection of EMI.

While the invention has been principally described with reference to a preferred embodiment as proximity sensor, it will be understood by those skilled in the art that the invention is not limited thereto. For example, when powered by a battery, the sensor has the attributes of a classic two-state switch and, thus, can be interconnected in logical configurations or used as a switch in AC or DC systems. With the very low power consumption capability of the sensor, the use of heretofore unfeasible alternate power schemes (other than battery or conventional) is also now possible. While the sensing operation has been described in relation to the target approaching one coil, it is to be understood that the target and coil assemblies may be made such that the target moves from one coil to the other, providing twice the target sensitivity and some unique sensing schemes. Although the voltage pulse applied to the sensor is preferred for the described circuit implementation, any waveshape can be utilized, including one having the attributes of a continuous sine wave. It is also to be appreciated that the description of the included proximity switch design is a subject of the inherent analog signal to target relationship present at the sensor. As well, the sensor can be integrated into other transducers, such as pressure transducers, to take further advantage of its low-power, noncontacting proximity-sensing capability. In addition, while there are particular advantages (e.g., temperature stability, EMI immunity, equal inductive division) to configuring the sensor with identical reference and sense coils, the invention embraces an unbalanced arrangement where these coils are not identical. These and many other modifications and variations are possible and intended to be included within the scope of the following claims.

The embodiments of the invention in which an exclusive property or privilege is claimed are defined as follows:

1. A proximity sensor comprising:
    an inductive divider network having a reference inductor and a sensor inductor connected in series between an input and ground to receive a voltage signal, said network having an output at the junction between said inductors, said sensor inductor having an inductance that varies in a predetermined manner with the proximity of a target object thereto;
    pulse means for applying a plurality of spaced apart voltage pulses to the input of said inductive divider network to produce an output voltage at the output thereof for each applied pulse; and
    detector means responsive to said output voltage for providing a target status signal indicative of the proximity of the target object to said sensor inductor.

2. The proximity sensor of claim 1, wherein said reference inductor has an inductance that remains substantially constant as the inductance of said sensor inductor varies with the proximity of the target object.

3. The proximity sensor of claim 1, wherein said sensor inductor has an inductance that varies in a predetermined manner with the proximity of said target object.

4. The proximity sensor of claim 1, wherein said sensor inductor and reference inductor have equal characteristic inductances.

5. The proximity sensor of claim 4, wherein said sensor inductor comprises a sense coil and said reference inductor comprises a reference coil, said sense and reference coils being wound upon a core and arranged and connected with one another such that a given external magnetic field induces a current in each of said coils, the current induced in said sense coil cancelling the current induced in said reference coil.

6. The proximity sensor of claim 1, wherein said pulse means applies a voltage pulse having a predetermined duration during each one of a plurality of successive system periods and wherein said detector means is energized during each of said system periods in synchronism with the application of the voltage pulse to said inductive divider network.

7. The proximity sensor of claim 6, wherein the detector means is energized by the voltage pulse produced by said pulse means.

8. The proximity sensor of claim 6, further including a battery, said battery being the sole source of power for said proximity sensor.

9. The proximity sensor of claim 6, wherein the target status signal produced by said detector means is an optical signal.

10. The proximity sensor of claim 6, wherein the target status signal produced by said detector means is an AC signal.

11. The proximity sensor of claim 6, wherein the target status signal produced by said detector means is a DC signal.

12. A method for sensing proximity of a target object to a sensor inductor, comprising the steps of:
connecting said sensor inductor in series with a reference inductor to form an inductive divider network;
applying a voltage pulse to said inductive divider network; and,
detecting the resultant voltages across said sensor inductor to provide an indication of the proximity of the target object to said sensor inductor.

13. The method of claim 12, wherein said step of applying comprises applying a voltage pulse to said inductive divider network during each one of a plurality of successive system periods, and wherein said step of detecting comprises detecting the resultant voltage across said sensor inductor in synchronism with the application of said voltage pulses.

14. The method of claim 13, wherein said step of detecting inclues providing an optical output signal indicative of the proximity of said target object ot said sensor inductor.

15. The method of claim 13, wherein said step of detecting includes the step of energizing a detector circuit with the voltage pulse that is applied to said inductive divider network.

* * * * *

UNITED STATES PATENT AND TRADEMARK OFFICE
CERTIFICATE OF CORRECTION

PATENT NO. : 4,845,429

DATED : July 4, 1989

INVENTOR(S) : Bernard J. Burreson

It is certified that error appears in the above-identified patent and that said Letters Patent is hereby corrected as shown below: On the title page:

At [57] (ABSTRACT), line 12, after "sensor" insert --inductors--;

Column 1, line 14, "including" should be --include--;

Column 1, line 40, "and" should be --can--;

Column 2, line 40, "source" should be --sources--;

Column 2, line 44, "this" should be --thus--;

Column 2, lines 46 and 47, "fibroptic" should be --fiberoptic--;

Column 2, line 59, "indicator" should be --inductor--;

Column 3, line 26, "energies" should be --energizes--;

Column 3, line 29, "indicator" should be --inductor--;

Column 4, line 8, "analytic" should be --analytical--;

Column 4, line 59, "equilavent" should be --equivalent--;

UNITED STATES PATENT AND TRADEMARK OFFICE
CERTIFICATE OF CORRECTION

PATENT NO. : 4,845,429

DATED : July 4, 1989

INVENTOR(S) : Bernard J. Burreson

It is certified that error appears in the above-identified patent and that said Letters Patent is hereby corrected as shown below:

Column 5, line 26, "doman" should be --domain--;

Column 7, line 50, "response" should be --responds--;

Column 8, line 59, after "divider" insert --network--;

Column 9, line 35, "teo" should be --two--;

Column 9, line 61, "pluse" should be --pulse--;

Column 10, line 20, "and" should be --an--;

Column 11, line 3, "agan" should be --again--;

Column 11, line 21, "forgeoing" should be --foregoing--;

Column 11, line 45, after "as" insert --a--;

Column 11, line 58, after "other," insert --thus--;

Column 11, line 65, "subject" should be --subset--;

Column 14, line 7, "inclues" should be --includes--;

Column 14, line 8, "ot" should be --to--;

After the reference (REFERENCES CITED/U.S. PATENT DOCUMENTS) "3,454,869 7/1969 Strauss et al. 324/234X" add --3,491,289 1/1970 Petrihi--;

After the reference "4,519,256 5/1985 Daniels 307/118X"; add --FOREIGN PATENT DOCUMENTS

UNITED STATES PATENT AND TRADEMARK OFFICE
CERTIFICATE OF CORRECTION

PATENT NO. : 4,845,429
DATED : July 4, 1989
INVENTOR(S) : Bernard J. Burreson

Page 3 of 3

It is certified that error appears in the above-identified patent and that said Letters Patent is hereby corrected as shown below:

60-36976 2/1985 Japan
2902157 7/1980 W. Germany--.

Signed and Sealed this

Third Day of July, 1990

Attest:

HARRY F. MANBECK, JR.

Attesting Officer

Commissioner of Patents and Trademarks